United States Patent
Burton et al.

(10) Patent No.: US 8,828,481 B2
(45) Date of Patent: Sep. 9, 2014

(54) METHOD OF DEPOSITING SILICON ON CARBON MATERIALS AND FORMING AN ANODE FOR USE IN LITHIUM ION BATTERIES

(75) Inventors: David J. Burton, Waynesville, OH (US); Max L. Lake, Yellow Springs, OH (US); Maryam Nazri, Bloomsfield Hills, MI (US)

(73) Assignee: Applied Sciences, Inc., Cedarville, OH (US)

( * ) Notice: Subject to any disclaimer, the term of this patent is extended or adjusted under 35 U.S.C. 154(b) by 1533 days.

(21) Appl. No.: 12/107,254

(22) Filed: Apr. 22, 2008

(65) Prior Publication Data

US 2008/0261116 A1  Oct. 23, 2008

Related U.S. Application Data

(60) Provisional application No. 60/913,321, filed on Apr. 23, 2007.

(51) Int. Cl.
| | |
|---|---|
| *H01M 4/58* | (2010.01) |
| *H01M 4/04* | (2006.01) |
| *B82Y 10/00* | (2011.01) |
| *H01M 4/139* | (2010.01) |
| *H01M 4/13* | (2010.01) |
| *C23C 16/24* | (2006.01) |
| *B82Y 30/00* | (2011.01) |
| *H01M 4/38* | (2006.01) |
| *H01M 4/587* | (2010.01) |
| *H01M 10/052* | (2010.01) |

(52) U.S. Cl.
CPC .............. *H01M 4/38* (2013.01); *H01M 4/0421* (2013.01); *B82Y 10/00* (2013.01); *H01M 4/139* (2013.01); *H01M 10/052* (2013.01); *H01M 4/13* (2013.01); *C23C 16/24* (2013.01); *B82Y 30/00* (2013.01); *Y02T 10/7011* (2013.01); *H01M 4/587* (2013.01); *Y02E 60/122* (2013.01)
USPC .......................................... 427/113; 429/322

(58) Field of Classification Search
CPC ...... Y02E 60/122; H01M 4/00; H01M 10/00; H01M 2010/00
USPC ................... 427/113, 231.8; 429/322, 231.95
See application file for complete search history.

(56) References Cited

U.S. PATENT DOCUMENTS

| | | | |
|---|---|---|---|
| 5,837,081 A | 11/1998 | Ting et al. | |
| 6,887,511 B1 * | 5/2005 | Shima et al. | ..................... 427/58 |

(Continued)

FOREIGN PATENT DOCUMENTS

| | | |
|---|---|---|
| WO | 2006097380 A1 | 9/2006 |
| WO | WO 2006/097380 * | 9/2006 |

OTHER PUBLICATIONS

Invitation to Pay Additional Fees and Communication Relating to the Results of the Partial International Search pertaining to International application No. PCT/US2008/061197dated Apr. 2, 2009.

(Continued)

*Primary Examiner* — Michael Cleveland
*Assistant Examiner* — Tabassom Tadayyon Elsami
(74) *Attorney, Agent, or Firm* — Dinsmore & Shohl LLP

(57) ABSTRACT

A method of modifying the surface of carbon materials such as vapor grown carbon nanofibers is provided in which silicon is deposited on vapor grown carbon nanofibers using a chemical vapor deposition process. The resulting silicon-carbon alloy may be used as an anode in a rechargeable lithium ion battery.

17 Claims, 2 Drawing Sheets

(56) References Cited

U.S. PATENT DOCUMENTS

| | | | |
|---|---|---|---|
| 6,988,304 B2 | 1/2006 | Moseley et al. | |
| 7,189,476 B1 | 3/2007 | Macklin et al. | |
| 2002/0037247 A1* | 3/2002 | Pruett | 423/447.3 |
| 2003/0165740 A1 | 9/2003 | Edwards et al. | |
| 2004/0126659 A1* | 7/2004 | Graetz et al. | 429/218.1 |
| 2007/0059600 A1 | 3/2007 | Kim et al. | |
| 2007/0076349 A1* | 4/2007 | Dementiev et al. | 361/502 |
| 2007/0207381 A1* | 9/2007 | Ohtsuka et al. | 429/218.1 |
| 2008/0145761 A1* | 6/2008 | Petrat et al. | 429/231.8 |
| 2008/0280169 A1* | 11/2008 | Niu et al. | 429/13 |
| 2008/0280207 A1* | 11/2008 | Patoux et al. | 429/231.8 |
| 2009/0068553 A1 | 3/2009 | Firsich | |

OTHER PUBLICATIONS

Jan. 23, 2009 letter to Richard A. Killworth from Mark P. Levy, with attachments (Exhibits 1-4).

M. Wang et al, "Electrochemical Intercalation of Lithium into Carbon Nanoparticles" Russian Journal of Electrochemistry, 2006, vol. 42 No. 8. pp. 901-903.

Zhang et al., "Electrochemical perfomance of lithium ion battery, nano-silicon-based, disordered carbon composite anodes with different microstructures", Science Direct, Journal of Power Sources, Jul. 31, 2003.

Dahn et al., "Energy and Capacity Projections for Practical Dual-Graphite Cells", Journal of the Electrochemical Society, 147 (3) 899-901 (2000).

Xue et al., "An Epoxy-Silane Approach to Prepare Anode Materials for Rechargeable Lithium Ion Batteries", Department of Physics, Simon Fraser University, Burnaby, British Columbia V5A 1S6, Canada, J. Electrochem. Soc., vol. 142, No. 9, Sep. 1995.

Buiel et al., "Li-insertion in hard carbon anode materials for Li-ion batteries", Department of Physics, Dallhousie University, Halifax, Nova Scotia, Canada, B3H 3J5, Electrochemicia Acta 45 (1999) 121-130.

Wang et al., "New Additives to Improve the First-Cycle Charge-Discharge Performance of a Graphite Anode for Lithium-Ion Cells", Journal of the Electrochemical Society, 152 (10) A1996-A2001 (2005).

Cao et al., "Surface-Modified Graphite as an Improved Intercalating Anode for Lithium-Ion Batteries", Electrochemical and Solid-State Letters, 6 (2) A30-A33 (2003).

Mueller-Neuhaus et al., Understanding Irreversible Capacity in $Li_xNi1-yFe_yO_2$ Cathode Materials, Journal of the Electrochemical Society, 147 (10) 3598-3605 (2000).

Robert F. Service, "Weight Loss for Batteries" ScienceNOW Daily News, Aug. 14, 2009.

* cited by examiner

METHOD OF DEPOSITING SILICON ON CARBON MATERIALS AND FORMING AN ANODE FOR USE IN LITHIUM ION BATTERIES

CROSS-REFERENCE TO RELATED APPLICATIONS

This application claims the benefit of U.S. Provisional Application No. 60/913,321, filed Apr. 23, 2007, entitled LITHIUM RESERVOIR NANOCARBONS FOR LITHIUM ION BATTERIES. The entire contents of said application are hereby incorporated by reference.

BACKGROUND OF THE INVENTION

The present invention relates to a method of depositing silicon onto a carbon material such as carbon nanofibers or composites formed from carbon nanofibers to form an alloy which can undergo lithiation/delithiation and which may be used as an anode in lithium ion batteries.

The use of lithium ion batteries as rechargeable power sources represent a promising technology for use in the development of consumer electronics and electric-based vehicles as they can replace traditional aqueous batteries such as lead-acid, nickel metal hydride, nickel-cadmium, and nickel hydride batteries.

Current lithium ion batteries typically use lithium cobalt oxide as the cathode and carbon or graphite as the anode. Efforts have been made to increase the energy density and power capability of the anode in lithium-ion batteries to provide improved operating features for electric and/or hybrid-type vehicles, cordless power tools, and electronics. For example, recent research indicates that anodes formed from nanocarbon materials can provide increases in both energy storage and power capability. Some single-multi-walled carbon nanotubes have shown reversible intercalation capacities in excess of $LiC_6$.

Another area of interest in recent years has been the investigation of metals or alloys that will form alloys with lithium, as such materials are known to store as much as eleven times the energy of current negative electrodes made of carbon alone. Silicon, which has a theoretical capacity of up to 4200 mAh/g, is one such material. Carbon-silicon alloys have previously been formed through various milling processes and through solution deposition of siloxanes onto graphite.

However, the use of such carbon-silicon alloys has been limited for use in lithium batteries as they undergo a significant volume change as they incorporate and release lithium during charge and discharge. As silicon undergoes an approximate 300% volume expansion when fully charged, alloys containing silicon can fragment and lose electrical contact with the anode as the result of these volume changes. This phenomenon is particularly destructive when the active materials are in the form of particulates, frequently resulting in a rapid loss of capacity upon cycling.

Furthermore, the development of batteries designed for high charge/discharge rates show evidence of heat retention in the battery cell, which can ultimately degrade the performance of the battery cell. High thermal conductivity composites have been fabricated which facilitate heat transfer through the composite. See, for example, U.S. Pat. No. 5,837,081, which teaches the use of vapor grown carbon fibers to fabricate high thermal conductivity composites. Use of high thermal conductivity materials in the fabrication of the anode would serve to eliminate heat retention or heat build-up within the battery cell as it is subjected to high charge and discharge rates.

More recently, surface modification of carbon fibers has been achieved by coating with materials such as silicon to provide a high thermal conductivity network and provide the ability to survive repeated thermal cycling. See, for example, U.S. Pat. No. 6,988,304, which teaches modification of vapor grown carbon fibers for the purpose of forming a composite structure for containing a phase change material for use in aircraft brakes. It would be desirable to use a surface modification process on carbon substrates or composite preforms for use in lithium ion batteries.

Accordingly, there is still a need in the art for a method of modifying carbon materials which can be used to make an improved anode for use in a lithium ion battery.

SUMMARY OF THE INVENTION

The present invention meets that need by providing a method of depositing a durable silicon coating or layer on carbon materials such as vapor grown carbon fibers, vapor grown carbon nanofibers, conventional carbon fibers, graphite flakes, graphene platelets, carbon nanotubes, or composites formed from these materials. The resulting alloy may be used as an anode in a lithium ion battery.

According to one aspect of the present invention, a method is provided for depositing silicon onto a carbon material to form an alloy for use in lithium ion batteries. The silicon coating may comprise crystalline silicon, amorphous silicon, or silicon compounds such as silicon carbide and silicon oxide.

The method utilizes a chemical vapor deposition process and includes providing a carbon material selected from vapor grown carbon fibers, vapor grown carbon nanofibers, PAN or pitch derived carbon fibers, graphite flakes, graphene platelets, and carbon nanotubes; heating the carbon material at a temperature between about 100° C. to about 1200° C., and flowing a silicon-containing precursor gas in contact with the carbon material for a time sufficient for the gas to decompose and form a coating on at least the surface of the carbon material.

The precursor gas is selected from silane, a blend of silane and hydrogen, or a blend of silane and an inert gas.

The carbon material preferably comprises vapor grown carbon nanofibers. The vapor grown carbon nanofibers are preferably heated treated at a temperature above 700° C. prior to use in the chemical vapor deposition method.

Carbon or graphite additives may be added to the carbon material prior to the deposition process to increase the electrical conductivity of the resulting anode and provide additional capacity. Such additives may be selected from single-walled carbon nanotubes, multi-walled carbon nanotubes, exfoliated graphite flakes, graphite platelets, graphene particles, carbon black, and mesocarbon microbeads.

A conductive additive may also be added to the carbon material to provide thermal conductivity and mechanical reinforcement to the resulting anode. A preferred additive is macroscopic vapor grown carbon fibers having a diameter of from about 500 nm to 10 micrometers.

The carbon material may further include a carbide material or silicon compound selected from metal carbides, silicon carbide, or silicon oxides.

The carbon material, along with any additives, is preferably fabricated into the form of a composite or preform prior to silicon deposition.

The resulting silicon coating may comprise crystalline silicon, amorphous silicon, or silicon compounds such as silicon carbide or silicon oxides. The silicon is coated onto the carbon substrate at a thickness of about 0.001 microns and 100 microns, more preferably, at a thickness of about 2 to 100 nm, and most preferably, at a thickness of about 10 to 30 nm.

The method preferably further includes forming an anode by adding a binder to the silicon-coated carbon nanomaterial. The binder is preferably selected from polyvinylidene difluoride, EPDM, and polystyrene.

The resulting anode preferably has an electrical conductivity of from 0.01 ohm/cm to 0.5 ohm/cm, and a thermal conductivity of at least 50 W/m-K up to 1000 W/m-K. The anode has an irreversible capacity of from less than about 5% to 40% of total capacity, and a reversible capacity of at least 350 milliamp hour/gram (mAH/g).

The anode produced from the method of the present invention may be incorporated into lithium ion batteries for a number of uses. For example, lithium-ion batteries containing the anode of the present invention may be used to extend the range of hybrid and electric vehicles to a more practical usage of up to 150 miles.

In another embodiment of the invention, a lithiated carbon-silicon alloy is provided which is formed by providing a carbon material selected from vapor grown carbon fibers, vapor grown carbon nanofibers, PAN or pitch derived carbon fibers, graphite flakes, graphene platelets, and carbon nanotubes, heating the carbon material at a temperature between about 100° C. to about 1200° C.; flowing a silicon-containing precursor gas in contact with the carbon material for a time sufficient for the gas to decompose and form a coating on at least the surface of the carbon material; and evaporating lithium on the carbon-silicon alloy.

Accordingly, it is a feature of the present invention to provide a method of depositing silicon on the surface of carbon materials such as carbon nanofibers and to an anode produced from such modified nanofibers. Other features and advantages of the invention will be apparent from the following description, the accompanying drawings, and the appended claims.

DETAILED DESCRIPTION OF THE PREFERRED EMBODIMENTS

Figures 1A, 1B:
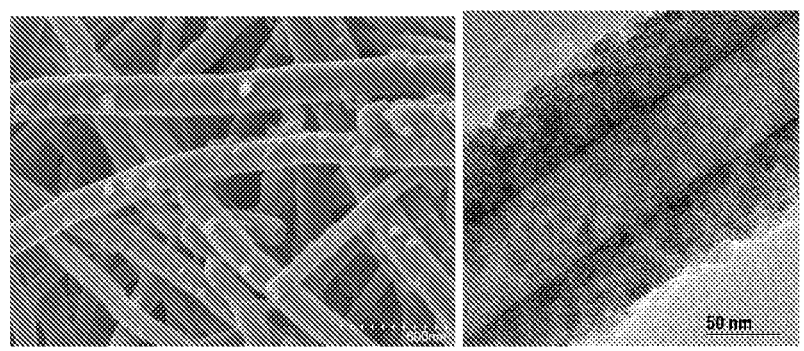
FIG. 1A is an electron microscope image of carbon nanofibers including a silicon coating deposited in accordance with an embodiment of the present invention.
FIG. 1B is an electron microscope image of carbon nanofibers including a silicon coating deposited in accordance with another embodiment of the present invention.

We have found that deposition of silicon onto carbon materials such as vapor grown carbon nanofibers allows the carbon nanofibers to function as an insertion host as well as a high surface area support for the silicon, connecting the carbon and silicon electrically and accommodating volume changes resulting from a lithiation-delithiation process when the resulting alloy is used as an anode.

The silicon alloy material is bonded to the carbon nanomaterial through an interphase region comprised of the alloy material and carbon. By "interphase," it is meant the transition region between pure carbon and pure silicon, which enhances the adherence between these two phases. In one embodiment, the interphase comprises silicon-carbon compounds such as silicon carbide.

The resulting silicon-carbon alloy exhibits high energy capacity and high power capability when used as an anode in a lithium ion battery cell. The resulting anode provides a significant increase in energy capacity up to 1000 mAh/g or higher for greater than 100 charge-discharge cycles. The use of such an anode provides a low irreversible capacity loss upon cycling.

While not wishing to be bound by theory, it is believed that the successful retention of capacity at high cycle numbers is indicative that the silicon coating is not fracturing and/or losing adhesion to the carbon nanofibers. This is further indicated by the fact that we have obtained efficiencies greater than 99.4% in capacity retention in a half cell configuration for more than 20 cycles at rates of C/2 (charge or discharge of the cell at two hours rate).

The method of the present invention also results in a boost in reversible and total charge capacity over that observed with the use of graphitic materials alone. The presence of the silicon alloying element facilitates prelithiation by reducing the irreversible capacity associated with the use of bare carbon nanofibers. By "prelithiation," it is meant a process in which the carbon material is charged with Li in a single-electrode configuration and then transferred under inert atmosphere conditions to be assembled into the final lithium-ion battery. This process creates an electrode with the surface layer of tightly bound Li which will not participate in battery cycling (the solid electrolyte interface (SEI) layer) already in place, eliminating the need for excess Li to compensate for the anode's irreversible capacity.

The silicon used in the method of the present invention may be derived from a variety of gas phase silicon bearing compounds including, but not limited to, methyl trichlorosilane and $SiH_4$. Preferred precursor gases include silane, a blend of silane and hydrogen, or blends of silane and an inert gas such as helium, nitrogen or argon. Silicon deposition may be performed at atmospheric pressure, at reduced pressure, or at an elevated pressure which is raised with respect to atmospheric pressure in order to control the rate and properties of the deposited silicon coating.

The resulting silicon coating may comprise crystalline silicon, amorphous silicon, or silicon compounds such as silicon carbide or silicon oxides. Amorphous silicon is preferred as it is believed to be deposited in a nanoscale domain such that nanoscale particles of amorphous silicon are incorporated into a graded interface of carbon to SiC or $SiO_x$ so that they are mechanically bound to the surface of the fiber. Further, such particles are sufficiently small that strain induced at the interface with the carbon/Si compound layer during expansion and contraction as the battery cell is subjected to charge/discharge cycles does not cause the silicon particles to de-bond from the fiber surface. Such a graded interface permits entrapment of inclusions and small particles that result in a more durable coating or layer. The silicon is coated onto the carbon substrate at a thickness of about 0.001 to 100 microns, more preferably, at a thickness of about 10 to 200 nm, and most preferably, about 10 to 30 nm. It should be appreciated that the nature of the coating can vary from unconnected islands of silicon to a continuous coating. Too little silicon will not adequately increase anode capacity while a thick layer of silicon will exceed the strain limit for expansion and contraction induced by charge/discharge cycling, becoming friable and lacking durability during battery cycling.

Referring to FIG. 1A, an electron microscope image of carbon nanofibers including a silicon coating in accordance with the present invention are shown. In FIG. 1A, the silicon has been deposited at low loadings such that it is deposited as small islands or nodules on the surface of the nanofibers. At higher loadings as illustrated in FIG. 1B, the silicon is deposited in a manner which produces a high surface area coating for rapid lithiation/delithiation for high power capability.

Figure 1C:
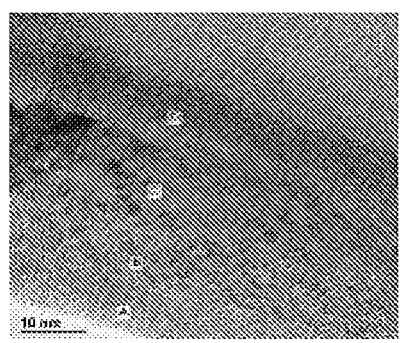
FIG. 1C is a transmission electron microscope image of a carbon nanofiber which has a graded nanostructure useful for adhering silicon.

FIG. 1C is a transmission electron microscope image which illustrates the nature of the graded interface transitioning from carbon in a graphitic structure at the core (D) to a blend of silicon compounds (C) and (B) and to a layer of amorphous silicon at the surface (A). (EDS analysis showed the presence A: silicon; B: silicon carbide; C: carbon with low amounts of silicon; and D: carbon). We believe that this graded interface of the silicon coating may contribute to retention of charge capacity of the anode after over 100 charge/discharge cycles, i.e., little or no fading occurs. This is in contrast to prior methods of coating silicon which result in fading of the charge capacity which can be so high as to render high charge/discharge cycling impractical.

Preferred nanofibers for use in the present invention are vapor grown carbon nanofibers comprised of long filaments having a graphitic nature. Suitable nanofibers include Pyrograf® II, commercially available from Applied Sciences, Inc. and Pyrograf Products, Inc. The preferred carbon nanofibers are essentially comprised of a graphitic hollow tube, referred to as the catalytic phase of the carbon nanofiber, and having essentially no turbostratic or disordered carbon on the surface of the nanofiber. This type of nanofiber is preferred as it is highly electrically conductive and has a high surface area and surface energy. The carbon nanofibers preferably have a length of from about 1 to about 500 micrometers in order to provide a sufficiently entangled and durable anode.

Alternatively, graphitic composites comprised of vapor grown carbon fibers, vapor grown carbon nanofibers, and graphene platelets may also be used.

The vapor grown carbon nanofibers are preferably heat treated prior to use in order to remove iron. Heat treatment is preferably performed in an inert atmosphere at a temperature above 700° C., and more preferably between about 1500° C. and 3,000° C.

Carbon and graphite additives may be added to the carbon material prior to the CVD silicon coating step to increase the electrical conductivity and capacity of the resulting anode. Such additives may be selected from single-walled carbon nanotubes, multi-walled carbon nanotubes, exfoliated graphite flakes, graphite platelets, graphene particles, carbon black, and mesocarbon microbeads. The additives may be added as a dry powder or by incorporation with a solvent to form a slurry. Such additives may be added by conventional techniques for incorporating solids into liquid solutions such as planetary and impeller type mixers.

A conductive additive may also be added to the carbon material before the CVD coating step to provide thermal conductivity and mechanical reinforcement to the resulting anode. The conductive additive may be added to the carbon material by blending as a dry powder or by incorporation with a solvent to form a slurry. A preferred additive is macroscopic vapor grown carbon fibers having a diameter of from about 500 nm to 10 micrometers. Such vapor grown carbon fibers are highly graphitizable and may be added in selected proportions of about 1 to 90% by weight and more preferably, 10 to 30% by weight to provide the desired reinforcement and thermal conductivity.

The carbon nanomaterial may further include a carbide material or silicon compound selected from metal carbides, silicon carbides, or silicon oxides. Such additives are incorporated by conventional mixing techniques such as impeller or planetary mixing prior to the silicon chemical vapor deposition step. The addition of such carbide materials creates a strong interface with the underlying graphite component (e.g., vapor grown carbon nanofibers), with deposition of the nanoscale silicon particles within inclusions and on the surface of the carbon nanomaterial, thus improving the durability of the silicon coating.

The carbon material, along with any of the additives described above, is preferably fabricated into the form of a low-density composite or preform prior to the chemical vapor deposition process. By "composite" or "preform," we mean that the carbon materials are provided in a form which excludes the use of carbon nanofiber paper. Preferably, the carbon material form used is less than about 250 micrometers in thickness so that the silicon will be uniformly deposited on the fibers. Where the carbon materials are in the form of a preform, the preform may be produced from an aerogel, foam, or composite structure. If the fibrous carbon and graphitic materials are formed as a composite, the chemical binder or matrix content is minimal, comprising less than 20 weight percent of the total composite, in order to allow the silicon to be uniformly deposited throughout the preform.

Where vapor grown carbon nanofibers are used as the carbon material, such nanofibers are preferably incorporated into preforms from the as-grown state, which reduces the number of high temperature annealing treatments needed as well as allowing fabrication of the preforms while the fibers are in the "green" non-graphitized state, resulting in less fiber damage through handling. Alternatively, the carbon materials may be heat treated prior to fabrication of the preform so that no further heat treatment is required. This allows elastomeric binders or other binders which will not survive heat treatment to be used to fabricate the composite preforms.

Rigid preforms can be constructed using chemical binders to hold the fibers in place within the composite preform. Alternatively, elastomeric binders may be used to impart flexibility if no further heat treatment is required, or graphitizable binders such as polymerized furfuryl alcohol may be used as a solvent suitable for dispersing carbon nanofibers. For example, appropriate lengths of vapor grown carbon nanofibers may be spread by hand on the base of a compression mold in the desired fiber lay-ups. The thin layers of the aligned fibers are then saturated with binder and placed in a mold, with the molding being programmed for a specific time-temperature-pressure cycle. The fiber volume in the preforms is controlled by compression to prescribed volumes using mold stops. After molding, the resulting panels are trimmed, measured, and weighed. Following densification and heat treatment, the panels are machined to specimen size for further processing. Carbonization of the panels is then performed by framing the panels between graphite plates and slowly heating the panels to 1000° C. (1832° F.) in a purified argon atmosphere. This process is generally carried out over a 3 to 4 day period.

In an alternative method of forming a preform comprised mainly of carbon nanofibers, the carbon nanofibers (along with any additives) are combined in solution by mixing and dispersing the suspension using sonication or other low shear/high energy methods. Following dispersion, the carbon material suspension is poured over a vacuum-assisted filtration system. Preforms are allowed to dry in the system and are then collected. Where the preforms are fabricated with a binder, this may require additional processing such as curing or compression molding.

In the CVD method of coating carbon materials such as nanofibers with silicon, the nanofibers (in fiber form or in the form of a preform), along with any additives, are preferably placed in a vessel including at least one gas inlet and one gas outlet. The vessel is then inserted into a heating chamber, and is heated in an inert atmosphere or under vacuum at a temperature between about 100° C. to about 1200° C. A silane gas or a blend of silane gas and hydrogen, or a blend of silane gas and an inert gas such as nitrogen or argon is then flowed over and through the carbon material for about 15 seconds to about 60 minutes such that it decomposes, leaving a silicon-based coating on at least the exterior surface of the nanomaterial. The deposition may be conducted at atmospheric pressure, reduced pressure, or elevated pressure so as to control the deposition rate and properties of the coating on the fibers or preform. The silane gas is then purged from the vessel with an inert gas such as nitrogen or argon and cooled.

It should be appreciated that the deposition temperature varies depending on the source gas used. For example, when silane is used, a deposition temperature of about 410° C. or higher is used to allow decomposition of the silane gas into hydrogen and silicon components. Operation at a temperature range near the formation temperature for crystalline silicon and silicon carbide for a short time duration will allow formation of such silicon compound coatings transitioning to amorphous silicon on the surface of the fiber.

In another method of coating the carbon nanomaterials, a free flowing carbon nanomaterial in the form of a powder is loaded into a fluidized bed, and is fluidized in nitrogen and heated between about 100 to 1200° C. A silane gas or blend thereof is passed through the fluidized bed with or without the aid of an inert gas. The fluidized bed is then purged with nitrogen to remove the silane, and the carbon nanomaterial is removed from the fluidized bed while hot or after the fluidized bed cools to room temperature.

In yet another method, the carbon nanomaterial is provided as a preform which may comprise a veil of chopped carbon fibers with a binder. The preform is passed through a heated chamber in a box or belt furnace which includes a continuous flow of silane at a temperature between about 100° C. to 1200° C. The carbon nanomaterial preform remains in contact with the silane flow for a time ranging from about 10 seconds to about 60 minutes to achieve the desired coating.

Another suitable method for depositing silicon is described in U.S. Pat. No. 6,988,304, the disclosure of which is hereby incorporated by reference. The interior surface of a porous nanofiber composite may be coated by chemical vapor infiltration. Hydrogen is bubbled through liquid methyltrichlorosilane (MTS) to form a coating precursor which is vaporized and transported into a coating chamber heated between 900 and 1100° C. The composite to be coated is positioned a distance away from the precursor inlet and in an orientation in the coating furnace so as to maximize the deposition rate of the coating. The MTS is thermally decomposed onto the interior surface of the composite to create a silicon-based coating that is of sufficient surface energy to wet and attract liquid phase change material (PCM). The temperature and pressure inside the coating furnace, the total gas flow rate, and the ratio of hydrogen to MTS are regulated to control the composition of the coating, which ultimately affects coating properties such as coefficient of thermal expansion (CTE), density, strength, surface energy, thermal conductivity, heat capacity, and other properties. Since the only function of the coating is to increase the surface energy of the fiber, the volume of the coating should be minimized to allow the void volume to be maximized, to reduce the thermal resistance between the fiber and PCM, and to reduce weight. While the coating thickness may range from 1 to 1000 nm, the coating thickness should preferably be about 10 to 250 nm.

In the method of forming a lithiated carbon-silicon alloy, a carbon-silicon alloy is formed using the method described above, and lithium is then evaporated on the carbon-silicon alloy. Various evaporation techniques may be used including heating, electron-gun evaporation, or sputtering techniques. For example, $Li_xSi$ alloy can be sputtered on the carbon-silicon alloy to deposit lithiated silicon on carbon nanofibers. This is a more preferred technique.

An anode may be formed from the silicon-coated nanofibers by a number of methods. In one method, the anode is formed by adding a binder to the silicon-coated carbon nanomaterial. Suitable binders include fluorinated polymers such as polyvinylidene difluoride (PVdF), non-fluorinated binders such as ethylene propylene diene monomers (EPDM), and polystyrene. In a preferred method, the polymeric binder comprises polyvinylidene difluoride and is dissolved in an organic solvent at a 5 wt % concentration. A mixture of C—Si composite fibers is then mixed with the binder and conductive carbon particulates. The carbon fibers coated with nanosize silicon are then mixed with a pre-dissolved elastomer binder such as PVdF in an organic solvent to make an ink-type slurry. The mixing is preferably performed by a milling process in which the C—Si composite and the pre-dissolved binder are placed in a ceramic jar containing ceramic balls and rolled for a period of about 10 to 60 minutes.

Other mixing techniques can be employed to make an ink-type slurry; for example, using a ratio of about 60-90 wt % C—Si composite, about 2-10 wt % binder, and about 5-20 wt % conductive carbon, respectively. The mixture is then milled for about 5 to 10 minutes to form a homogeneous slurry. The slurry paste is then coated on a copper substrate such as copper foil using a blade technique. The loading may be adjusted from 5 to 50 mg/cm$^2$. The coated sample is then dried under vacuum at about 100° C. for about 2 to 4 hours. An electrode is then cut from the coated foil and placed in a bottom cell against a metallic lithium electrode. A porous polypropylene-polyethylene separator soaked in an electrolyte (ethylene carbonate:dimethyl carbonate 50:50 containing 1 M LiPF$_6$ salt) is used to separate the C—Si electrode to form a Li electrode and function as an electrolyte for lithium ion conduction.

In another method of forming an anode, the C—Si composite is in the form of a thin preform and is used as an anode without the use of current collectors (i.e., a metal foil such as copper foil, with thickness in the range of 10-15 microns. The current collector functions as a plate to carry the electric current out of the batter and also as a support to keep the active material in the cell). An electrode is cut from the preform and placed in the bottom cell against a lithium electrode and the cell is then made as described above.

The resulting anode material demonstrates high thermal conductivity which will enhance heat removal from the battery cell, thereby reducing the risk of overheating during rapid charge/discharge cycles. The thermal conductivity of the anode may be in the range of 25 w/m-K to 1000 w/m-K, and preferably in excess of 1000 w/m-K, depending on the selection and respective loadings of carbon nanofiber, vapor grown carbon fiber, and other graphitic reinforcement materials.

Figure 2:
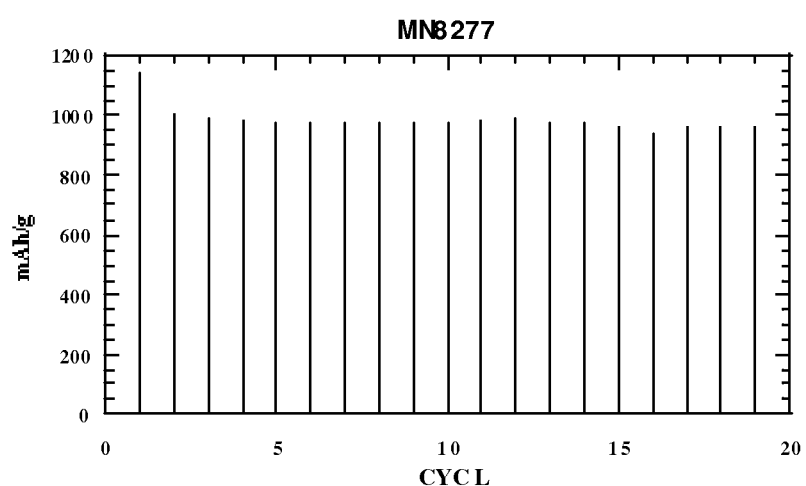
FIG. 2 is a graph illustrating the capacity of a carbon-silicon anode after thermal cycling.

Referring to FIG. 2, the capacity of a carbon-silicon anode is illustrated after electrochemical charge-discharge cycling. The electrochemical charge-discharge cycling is performed under constant current. A cell containing the C—Si composite electrode against a metallic lithium foil is constructed by separating the two electrodes by a porous separator containing 1 M of LiPF$_6$ in dimethyl carbonate-ethylene carbonate (50:50), and placing in a coin cell. The lithium insertion into C—Si composite is performed by applying a fixed current to dissolve lithium from the counter electrode and depositing it on the C—Si electrode. When the voltage of the cell reaches a value of 5 mV, the current sign is switched to withdraw the deposited lithium from the C—Si electrode and redeposit the lithium onto the Li counter electrode. This process is then repeated to obtain the cycling results. The results are reported in current (mA) multiplied by time (in hours) accumulated during each half cycle divided by the weight of the C—Si composite on the electrode.

Having described the invention in detail and by reference to preferred embodiments thereof, it will be apparent that modifications and variations are possible without departing from the scope of the invention.

What is claimed is:

1. A method of depositing silicon onto a carbon material to form an alloy for use in lithium ion batteries comprising: providing a carbon material selected from vapor grown carbon fibers, vapor grown carbon nanofibers, and PAN or pitch derived carbon fibers; wherein said carbon material further includes a carbide material selected from metal carbides, and silicon carbides; heating said carbon material at a temperature between about 100° C. to about 1200° C.; flowing a silicon-containing precursor gas in contact with said carbon material for a time sufficient for said gas to decompose and form a coating on at least the surface of said carbon material.

2. The method of claim 1 wherein said precursor gas comprises silane, a blend of silane and hydrogen, or a blend of silane and an inert gas.

3. The method of claim 1 wherein said carbon material comprises vapor grown carbon nanofibers.

4. The method of claim 3 wherein said vapor grown carbon nanofibers have been heated treated at a temperature above 700° C.

5. The method of claim 1 wherein said carbon material further includes a carbon or graphite additive selected from single-walled carbon nanotubes, multi-walled carbon nanotubes, exfoliated graphite flakes, graphite platelets, graphene particles, carbon black, and mesocarbon microbeads.

6. The method of claim 1 wherein said carbon material further includes a conductive additive comprising macroscopic vapor grown carbon nanofibers having a diameter of from about 500 nm to 10 micrometers.

7. The method of claim 1 wherein said carbon material has a length of from about 1 to about 500 micrometers.

8. The method of claim 1 wherein said carbon material is in the form of a composite or preform.

9. The method of claim 1 wherein said silicon is coated onto said carbon material at a thickness of about 0.001 and 100 microns.

10. The method of claim 1 wherein said silicon is coated onto said carbon material at a thickness of about 2 to 100 nm.

11. The method of claim 1 wherein said silicon-coated carbon material has a graded interface.

12. The method of claim 1 further including forming an anode by adding a binder to said silicon-coated carbon material.

13. The method of claim 12 wherein said binder is selected from polyvinylidene difluoride, EPDM, and polystyrene.

14. A method of depositing silicon onto a carbon material to form an alloy for use in lithium ion batteries comprising:
providing a carbon material selected from vapor grown carbon fibers, vapor grown carbon nanofibers, and PAN or pitch derived carbon fibers;
heating said carbon material at a temperature between about 100° C. to about 1200° C.;
flowing a silicon-containing precursor gas in contact with said carbon material for a time sufficient for said gas to decompose and form a coating on at least the surface of said carbon material; wherein said silicon-coated carbon material has a graded interface.

15. The method of claim 14 wherein said precursor gas comprises silane, a blend of silane and hydrogen, or a blend of silane and an inert gas.

16. The method of claim 14 wherein said carbon material comprises vapor grown carbon nanofibers.

17. The method of claim 14 further including forming an anode by adding a binder to said silicon-coated carbon material.

* * * * *